United States Patent
Shimoto et al.

[11] Patent Number: 5,830,563
[45] Date of Patent: Nov. 3, 1998

[54] INTERCONNECTION STRUCTURES AND METHOD OF MAKING SAME

[75] Inventors: Tadanori Shimoto; Yoshitsugu Funada; Koji Matsui; Yuzo Shimada; Kazuaki Utsumi, all of Tokyo, Japan

[73] Assignee: NEC Corporation, Tokyo, Japan

[21] Appl. No.: 752,798

[22] Filed: Nov. 20, 1996

[30] Foreign Application Priority Data

| | | | |
|---|---|---|---|
| Nov. 29, 1995 | [JP] | Japan | 7-310635 |
| May 20, 1996 | [JP] | Japan | 8-125016 |
| Oct. 29, 1996 | [JP] | Japan | 8-286643 |

[51] Int. Cl.$^6$ ................................................. B32B 3/00
[52] U.S. Cl. ........................... 428/209; 428/421; 428/901
[58] Field of Search ........................... 428/209, 901, 428/421

[56] References Cited

U.S. PATENT DOCUMENTS

| | | | |
|---|---|---|---|
| 4,824,511 | 4/1989 | Hartman et al. | 428/421 |
| 4,886,699 | 12/1989 | Carroll et al. | 428/209 |
| 4,996,097 | 2/1991 | Fischer | 428/220 |
| 5,149,590 | 9/1992 | Arthur et al. | 428/421 |
| 5,300,735 | 4/1994 | Yokono et al. | 428/901 |
| 5,349,155 | 9/1994 | Yamagishi et al. | 219/121.71 |
| 5,358,775 | 10/1994 | Horn III | 428/421 |
| 5,401,334 | 3/1995 | O'Melia et al. | 428/421 |
| 5,502,139 | 3/1996 | Toh et al. | 528/373 |
| 5,582,918 | 12/1996 | Gouardères | 428/421 |
| 5,592,016 | 1/1997 | Go et al. | 257/530 |
| 5,633,532 | 5/1997 | Sohara et al. | 257/752 |

*Primary Examiner*—Cathy F. Lam
*Attorney, Agent, or Firm*—Sughrue, Mion, Zinn, Macpeak & Seas, PLLC.

[57] ABSTRACT

This invention relates to an interconnection structure comprising one or more insulating films and one or more layers of conductor electrode patterns, wherein at least one of the insulating films consists of a fluorene skeleton-containing epoxy acrylate resin, and to a method of making a multilayer interconnection structure including the steps of roughening the surface of an insulating resin layer and forming a conductor thereon by electroless plating, wherein the average roughness (Ra), maximum roughness (Ry) and conductor thickness (T) of the roughened surface of the insulating resin layer satisfy the following relations:

$$0.2 \leq Ra \leq 0.6 \text{ (unit: } \mu m) \qquad (1)$$

$$0.02 \leq Ra/T \leq 0.2 \qquad (2)$$

$$0.05 \leq Ry/T \leq 0.5 \qquad (3)$$

and catalyst nuclei for electroless plating are supplied by applying a solution of a metallic salt to the roughened surface of the insulating resin layer or dipping the substrate in a solution of a metallic salt, drying and heat-treating the substrate, and then subjecting it to displacement palladium plating.

9 Claims, 11 Drawing Sheets

Semicured film of epoxy acrylate resin (surface: rough)

Formation of epoxy acrylate resin film (surface: smooth) and connection patterns Formation of conductor (electroless plating)

Formation of epoxy acrylate resin film (surface: smooth) and via holes

Formation of conductor (electroless plating)

FIG. 8A

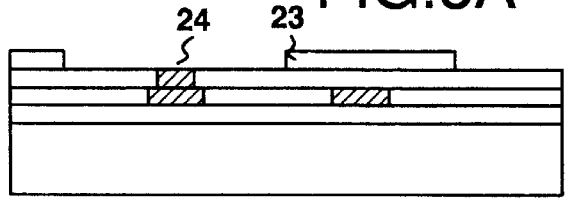

Formation of epoxy acrylate resin film (surface: smooth) and connection patterns

FIG. 8B

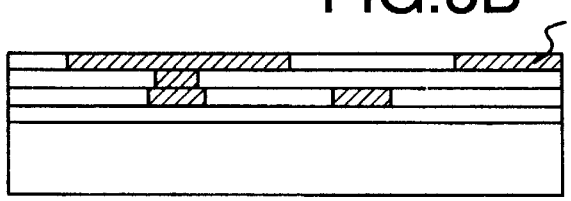

Formation of conductor (electroless plating)

FIG. 8C

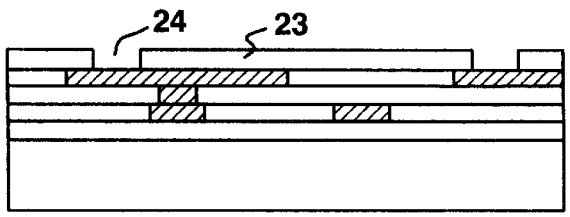

Formation of epoxy acrylate resin film (surface: smooth) and connection patterns

FIG. 8D

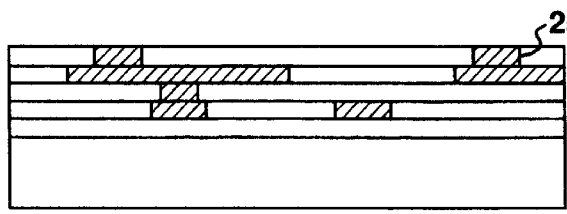

Formation of conductor (electroless plating)

FIG. 8E

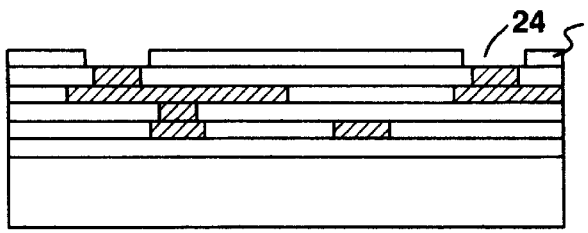

Formation of epoxy acrylate resin film (surface: smooth) and connection patterns

FIG. 8F

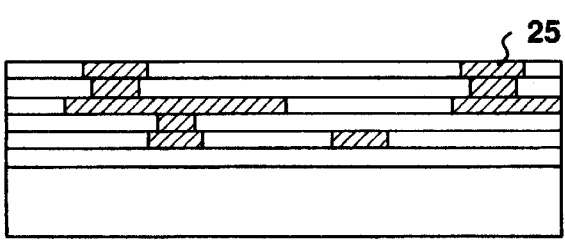

Formation of conductor (electroless plating)

FIG. 9A

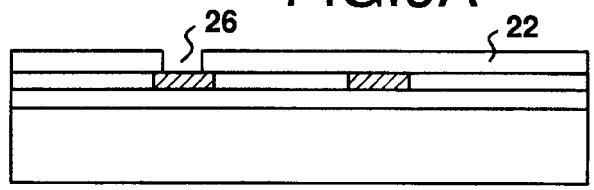

Formation of semicured epoxy acrylate resin film (surface: rough) and via holes

FIG. 9B

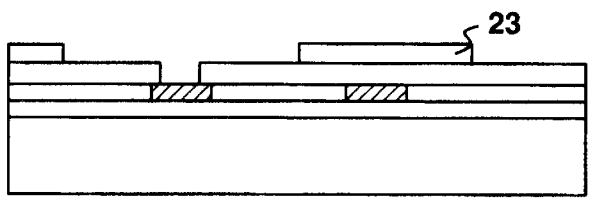

Formation of semicured epoxy acrylate resin film (surface: smooth) and connection patterns

FIG. 9C

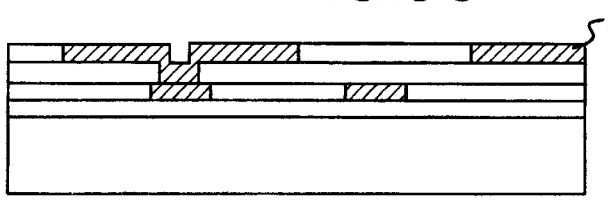

Formation of conductor (electroless plating)

FIG. 9D

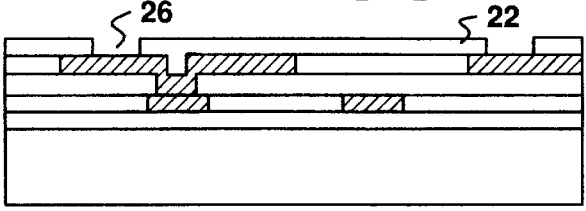

Formation of semicured epoxy acrylate resin film (surface: rough) and via holes

FIG. 9E

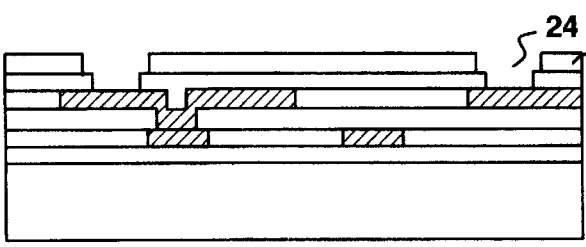

Formation of epoxy acrylate resin film (surface: smooth) and connection patterns

FIG. 9F

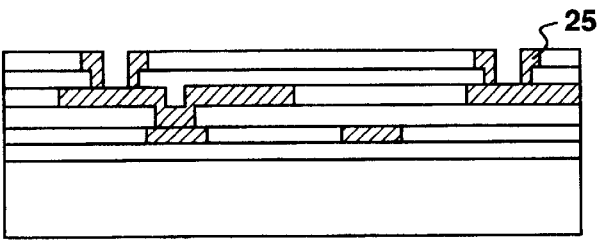

Formation of conductor (electroless plating)

Benzocyclobutene film
(surface: rough)

Formation of
benzocyclobutene film
(surface: smooth) and
connection patterns

Formation of conductor
(electroless plating)

Benzocyclobutene film
(surface: rough)

Formation of
benzocyclobutene film
(surface: smooth) and
connection patterns

Formation of conductor (electroless plating)

Benzocyclobutene film (surface: rough)

Formation of benzocyclobutene film (surface: smooth) and via holes

Formation of through-holes

Formation of conductor (electroless plating)

INTERCONNECTION STRUCTURES AND METHOD OF MAKING SAME

BACKGROUND OF THE INVENTION

1. Field of the Invention

This invention relates to interconnection structures as typified by electronic components such as printed wiring boards, and more particularly to multilayer interconnection structures for use with assembled boards having semiconductor devices mounted thereon. This invention also relates to a method of making such multilayer interconnection structures at low cost.

2. Description of the Related Art

With an increase in the operating speed of semiconductor devices and in the degree of integration thereof, interlayer insulating films or passivation films constituting wiring boards having such semiconductor devices mounted thereon have come to be required to have high thermal resistance and, in addition, a low dielectric constant, a low degree of water absorption, a low coefficient of thermal expansion, good adhesion between conductor and insulating film, good chemical resistance and the like. More recently, in order to simplify the formation of via holes for connecting upper and lower electrode patterns, it is also desirable that the material itself has photosensitivity so as to permit via holes to be formed according to a process similar to that using a photoresist.

At present, polyimide resins (for example, Japanese Patent Laid-Open Nos. 284455/'92 and 165217/'93), organosilicon resins (for example, Japanese Patent Laid-Open Nos. 43455/'91, 46934/'92, 130364/'94 and 22508/'95) and the like have been proposed as interlayer insulating film materials having the above-described properties.

With the aforesaid polyimide resins, water of condensation is produced during cure and, moreover, the photosensitive group introduced into the molecule is eliminated. As a result, a high degree of shrinkage occurs during cure, making it difficult to form highly precise and minute via holes. In addition, they have the disadvantage that, when a plurality of films are formed, cracks may be produced owing to shrinkage stresses.

With the organosilicon resins, the problem of shrinkage during cure is not so serious as with the polyimide resins, but the use of an organic solvent as a developer for the formation of via holes causes the cured film present in the exposed regions to swell, resulting in reduced resolution. Consequently, it is difficult to form highly precise and minute via holes and, therefore, to make a high-density multilayer interconnection structure. Moreover, the use of a developer based on an organic solvent is not desirable from the viewpoint of environmental protection, safety and health.

Furthermore, both the polyimide resins and the organosilicon resins have a curing temperature of as high as 400° C., so that inexpensive resin substrates such as common printed wiring boards and molded resin wiring boards cannot be used because of their low thermal resistance. Consequently, only substrates such as ceramics and silicon must be chosen to form an insulating film thereon, resulting in an inevitable increase in cost.

On the other hand, an epoxy resin is well known as a material which can form an insulating film on inexpensive resin substrates. However, this epoxy resin has various disadvantages such as high dielectric constant, high coefficient of thermal expansion, low glass transition temperature, poor resolution, and poor flatness of the cured film, and its use is becoming difficult with the recent enhancement in the performance of electronic components.

In contrast, benzocyclobutene resin is known to have a well-balanced combination of properties required for interlayer insulating films or passivation films. In particular, benzocyclobutene resin has a degree of water absorption of as low as 0.25 wt. % and does not exhibit migration with copper owing to its characteristic molecular structure. Accordingly, there is known a multilayer interconnection structure having connections consisting essentially of copper, and a benzocyclobutene resin insulating film, for example, as illustrated in FIG. 13 (see, for example, Japanese Patent Publication No. 19973/'95).

Specifically, a layer of conductor connections 62 is formed on a substrate 61 such as a silicon wafer, ceramic or printed wiring board. Then, a benzocyclobutene resin film 63 is deposited thereon and via holes 64 for connecting upper and lower connections electrically are formed therein. Thereafter, copper connections 65 are formed thereon. Subsequently, benzocyclobutene resin insulating films and conductor connections (for example, of copper) are alternately formed until a multilayer interconnection structure having a desired number of layers is obtained.

A commonly known method for forming such interlayer insulating films of benzocyclobutene resin comprises applying a film of benzocyclobutene resin by spin coating, forming patterns therefrom according to a photolithographic process, and thermally curing the formed patterns. However, as described, for example, in *IEEE Transactions on Components, Packaging, and Manufacturing Technology— Part B*, Vol. 18, No. 1 (1995), p. 19, it is also known that, only when such an insulating film is formed on plate-like patterns consisting of copper, 3-aminopropyltriethoxysilane is applied prior to the application of benzocyclobutene resin in order to secure the long-term reliability of adhesion. An interconnection structure formed by this process is illustrated in FIG. 14. Specifically, a 3-aminopropyltriethoxysilane film layer 74 having a thickness of several tens of angstroms is formed on substrate 73 having a copper electrode 71 and a copper connection 72. Then, a benzocyclobutene resin film 75 is deposited thereon to form an interconnection structure 76.

According to this process, 3-aminopropyltriethoxysilane film layer 74 is formed between copper electrode 71 or copper connection 72 and benzocyclobutene resin film 75 to bring about an improvement in adhesion. On the other hand, this poses a problem in that copper ion migrates through this film layer 74. In the above-mentioned reference in which only grounding or power supply plate patterns are present, a reduction in insulating properties due to migration is on a practically negligible level because of the absence of fine connections. However, with the recent increase in the operating speed of electronic equipment, grounding plate electrodes and fine signal connections may frequently coexist together for the purpose of enhanced grounding. As a result, much attention is now focused on the problem of a reduction in insulating properties due to migration.

Meanwhile, the methods for the formation of a conductor are roughly divided into subtractive and additive methods, as typified by the fabrication of printed circuit boards. The former is a method for forming conductor patterns and insulated regions by subjecting a conductor deposited on the whole surface of an insulating substrate to a chemical treatment and thereby removing unnecessary portions thereof selectively. The latter is a method for forming conductor patterns by depositing an electrically conductive material on an insulating substrate according to a suitable technique such as electroless plating.

In the aforesaid subtractive method, a chemical agent is usually used for etching purposes. However, in order to form high-density patterns, dry etching must be employed because of the limits of wet etching, resulting in an increased cost. For this reason, the additive method based on electroless plating which is advantageous for the formation of fine connections is effective in forming conductor patterns. In order to form a conductor on the surface of an insulating substrate by electroless plating, a noble metal (e.g., palladium) acting as a catalyst needs to be supplied to the surface. However, the fact is that, since insulating substrates generally have a smooth surface, it is frequently difficult to supply thereto catalyst nuclei as described above.

SUMMARY OF THE INVENTION

In view of the above-described facts, it is an object of the present invention to provide a high-performance and high-density interconnection structure having excellent properties such as high thermal resistance, low dielectric constant, and low coefficient of thermal expansion. It is another object of the present invention to provide a high-performance and high-density multilayer interconnection structure in which highly precise and minute via holes can be formed according to a process similar to that using a photoresist.

It is still another object of the present invention to provide an interconnection structure having high insulation reliability in which, when benzocyclobutene resin is used, the long-term reliability of adhesion can be secured and the migration of copper and other ions can be prevented, without detracting from the excellent performance inherent in this resin.

It is a further object of the present invention to provide a method of making such interconnection structures at low cost.

The present inventors have made intensive investigations with a view to accomplishing the above-described objects, and have now completed the present invention.

Thus, according to a first aspect of the present invention, there is provided an interconnection structure comprising one or more insulating films and one or more layers of conductor electrode patterns, wherein at least one of the insulating films consists of a fluorene skeleton-containing epoxy acrylate resin.

According to a second aspect of the present invention, there is provided a multilayer interconnection structure comprising one or more interlayer insulating resin layers and one or more layers of conductor patterns which are alternately and successively formed on a surface of a substrate, wherein the surface regions of the interlayer insulating resin layer on which conductor patterns are to be formed are roughened in advance, conductor patterns are formed on the surface regions according to a wet process, and the average roughness (Ra), maximum roughness (Ry) and conductor thickness (T) of the roughened surface satisfy the following relations:

$$0.2 \leq Ra \leq 0.6 \text{ (unit: } \mu m) \tag{1}$$

$$0.02 \leq Ra/T \leq 0.2 \tag{2}$$

$$0.05 \leq Ry/T \leq 0.5 \tag{3},$$

as well as a method of making such a multilayer interconnection structure.

The present invention can provide interconnection structures having excellent properties such as high thermal resistance, low dielectric constant, and low coefficient of thermal expansion, and further having highly precise and minute via holes, so that the performance of electronic components and assembled boards can be improved and the sizes thereof can be reduced owing to an increase in density. Moreover, multilayer interconnection structures in accordance with the present invention can be made on inexpensive printed wiring boards and molded resin wiring boards, so that the costs of electronic components and assembled boards can be reduced.

Furthermore, the method of the present invention makes it possible to perform all conductor-forming steps according to a wet process, resulting in a further reduction in the manufacturing costs of electronic components and assembled boards.

BRIEF DESCRIPTION OF THE DRAWINGS

FIGS. 7 to 10 are schematic sectional views illustrating several steps in the method of making a multilayer interconnection structure in accordance with the second aspect of the present invention;

DETAILED DESCRIPTION OF THE PREFERRED EMBODIMENTS

Figure 1A:
FIG. 1 is a series of sectional views illustrating one embodiment of the method of making a multilayer interconnection structure in accordance with the present invention.
Figure 1B:
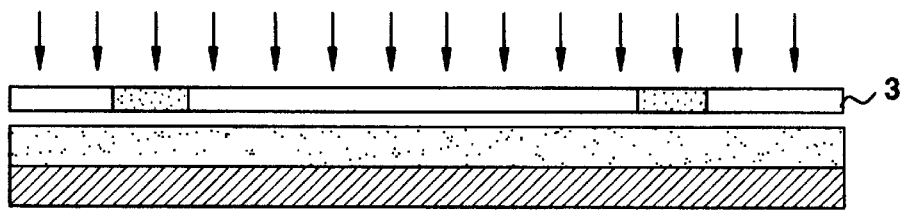
Figure 1C:
Figure 1D:
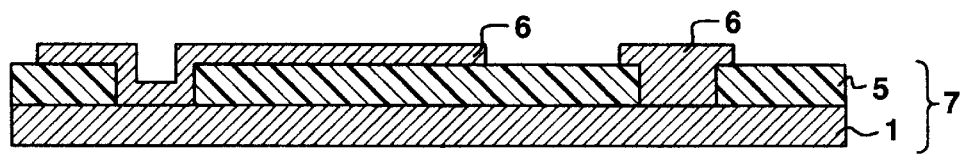

The present invention is more specifically described hereinbelow.

In the present invention, a multilayer interconnection structure is made by using a fluorene skeleton-containing epoxy acrylate resin as an interlayer insulating film material and forming conductor patterns thereon. As the fluorene skeleton-containing epoxy acrylate resin, a material represented by the following general formula (I) is preferably used.

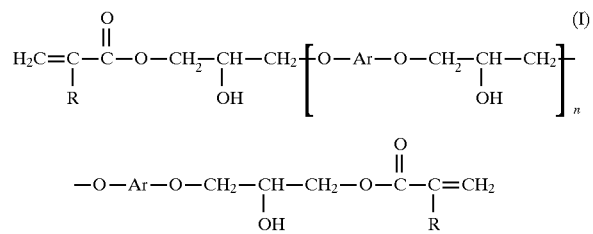

—Ar—:
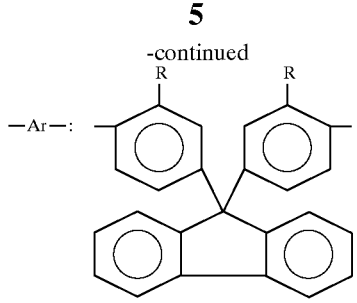

where R is a hydrogen atom or a lower alkyl group, and n is an integer of 0 to 20. In Japanese Patent Laid-Open No. 292611/'92, this material is disclosed in connection with its optical applications.

Generally, epoxy acrylate resin is a kind of material used to form interlayer insulating films for multilayer interconnection structures. However, it has now been found that the fluorene skeleton-containing epoxy acrylate resin of the above general formula (I) has higher thermal resistance, a lower coefficient of thermal expansion, and much more lower water absorption properties, as compared with ordinary epoxy acrylate resins. Conventionally, insulating materials having high thermal resistance have been disadvantageous in that they generally have a very high curing temperature. However, this resin can be cured at a temperature of about 160° to 200° C. and is highly suitable for use as an insulating material for multilayer interconnection purposes. Its coefficient of thermal expansion and water absorption properties are factors which have not been considered at all in connection with its optical applications disclosed in the above-mentioned Japanese Patent Laid-Open No. 292611/'92, and the present invention has been able to be made only on the basis of the discovery that this material is excellent in these points. It goes without saying that this material can be used not only for multi-layer interconnection structures, but also for single-layer interconnection structures.

FIG. 1 is a series of sectional views illustrating one embodiment of the method of making a multilayer interconnection structure wherein the interlayer insulating films for conductor electrode patterns are formed from a fluorene skeleton-containing epoxy acrylate resin.

A conductor film 1 consisting of a metal such as aluminum or copper is coated with a coating solution having dissolved therein a fluorene skeleton-containing epoxy acrylate resin of the above general formula (I), according to a coating technique such as spin coating, spray coating or printing. Thus, a coating film 2 is formed [FIG. 1 (a)]. After being baked, this coating film 2 is exposed to light through a glass mask 3 which has been subjected to a predetermined patterning treatment [FIG. 1(b)]. Then, this coating film 2 is developed by soaking it in an alkaline developing solution based on sodium carbonate or an amine to dissolve the unexposed portions thereof. Thereafter, this coating film is heat-treated (or post-baked) at 180°–200° C. for about 30 minutes to solidify the exposed portions thereof and thereby form an interlayer insulating film 5 having via holes 4 [FIG. 1(c)].

Thereafter, a conductor layer consisting of a metal such as copper or aluminum is formed on interlayer insulating film 5 according to a suitable technique such as sputtering, vapor deposition or electroless plating. Then, this conductor layer is etched into a desired shape according to a photolithographic technique or the like to form conductor connections 6. Thus, there is obtained a multilayer interconnection structure 7 [FIG. 1(d)].

Figure 1E:
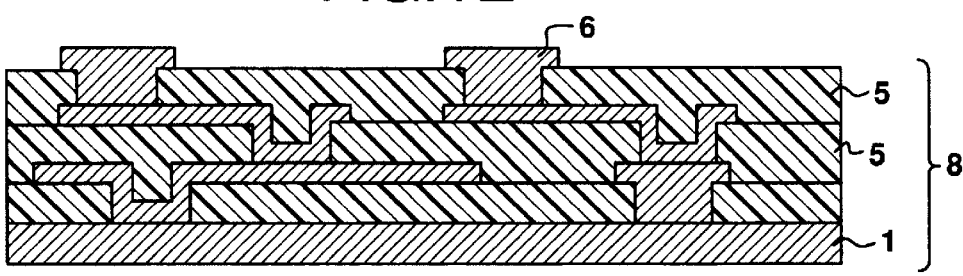
Figure 1F:
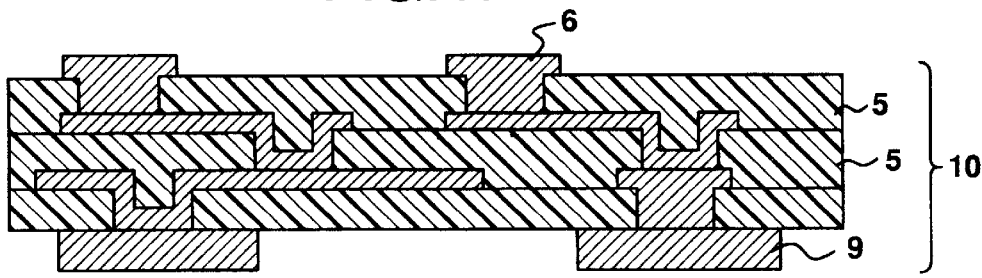

Subsequently, a multilayer interconnection structure 8 having any desired number of layers can be made by repeating the step of forming an interlayer insulating film and the step of forming conductor connections [FIG. 1(e)]. Moreover, if necessary, a multilayer interconnection structure 10 having conductor connections 9 can also be made by etching conductor film 1 into a desired shape, as illustrated in FIG. 1(f).

Since coating film 2 is developed with an alkaline developing solution, the exposed portions of coating film 2 do not swell and, moreover, the degree of shrinkage of interlayer insulating films 5 formed by thermal curing is as low as about 6%. Consequently, highly precise and minute via holes 4 can readily be obtained.

The interlayer insulating films so formed have excellent properties such as high thermal resistance, low dielectric constant, low coefficient of thermal expansion, and low degree of water absorption. Consequently, multilayer interconnection structures having such interlayer insulating films can be very effectively applied to high-speed and high-performance electronic components and assembled boards.

Alternatively, the multilayer interconnection structures of the present invention can be made by forming an insulating film comprising the fluorene skeleton-containing epoxy acrylate resin, on substrates comprising glass, ceramics, metals, heat-resisting films, silicon wafers, semiconductor devices and the like, and forming conductor electrode patterns thereon.

Moreover, as described above, the fluorene skeleton-containing epoxy acrylate resin can be heat-treated at 180°–200° C. for about 30 minutes to form an interlayer insulating film. Consequently, high-density multilayer interconnection structures can be formed even on very inexpensive resin substrates such as printed wiring boards and molded resin wiring boards, so that the cost of multilayer interconnection structures can be reduced.

Furthermore, the present invention can also provide an interconnection structure wherein conventionally known benzocyclobutene resin is used in combination with the aforesaid fluorene skeleton-containing epoxy acrylate resin to form an insulating film, thus achieving an improvement in adhesion while preventing the migration of copper and other metallic ions which has been regarded as a problem in the prior art. That is, an interconnection structure can be made by forming a film layer of the fluorene skeleton-containing epoxy acrylate resin over metallic conductor connections or metallic conductor electrodes, preferably in a patterned state, and then forming a benzocyclobutene resin film thereon. This embodiment is more specifically described below with reference to the drawings.

FIG. 11 is a series of schematic sectional views illustrating an embodiment of the method of making an interconnection structure wherein a film layer comprising a fluorene skeleton-containing epoxy acrylate resin of the above general formula (I) is formed on a substrate having metallic conductor connections or metallic conductor electrodes, and a benzocyclobutene resin film is formed thereon.

First of all, a substrate 43 having an electrode 41 and a connection 42 is coated with a fluorene skeleton-containing epoxy acrylate resin layer 44 having a thickness of about 0.1 to 1.0 μm, for example, by spin coating or other coating technique. This resin layer 44 is dried at 75° C. for 10 minutes and exposed to light, for example, having a wavelength of 365 nm and an intensity of 200 to 400 mJ/cm$^2$ [step (a)]. Then, for example, a benzocyclobutene resin film having photosensitivity is applied according to a coating technique such as spin coating or curtain coating, and subjected to exposure and development processes. Thus, a benzocyclobutene resin film 46 having via holes 45 is formed [step (b)]. After substrate 43 is heat-treated at 80°–200° C. for about 30 minutes, the fluorene skeleton-containing epoxy acrylate resin layer 44 present at the bottom of via holes 45 is removed by plasma etching or the like to obtain an interconnection structure 47 [step (c)].

Thereafter, if necessary, upper connections 48 consisting of a metal such as copper can be formed on benzocyclobutene resin film 46 by the combined use of a metallic conductor forming process (e.g., sputtering, vapor deposition, electroplating or electroless plating) and a photolithographic process [step (d)]. Moreover, a multilayer interconnection structure 49 having any desired number of layers can also be made by repeating the above-described steps (a) to (d) [FIG. 11(*e*)].

The aforesaid substrate 43 can be selected, for example, from glass, ceramics, metals, printed wiring boards, molded resin wiring boards, silicon wafers and semiconductor devices. Moreover, besides the foregoing rigid substrates, film-like substrates consisting of resin or metal can also be used.

According to the present invention, it is also possible to deposit a fluorene skeleton-containing epoxy acrylate resin film, pattern it so as to exist only on metallic conductor connections or metallic conductor electrodes, and form a benzocyclobutene resin film thereon. This method is illustrated in FIG. 12.

First of all, similarly to the above-described embodiment, a substrate 53 having an electrode 51 and a connection 52 consisting of a metal such as copper is coated with a fluorene skeleton-containing epoxy acrylate resin layer 54 having a thickness of about 0.1 to 1.0 μm, for example, by spin coating or other coating technique. This resin layer 54 is dried at 75° C. for 10 minutes [step (a)]. Then, this resin layer is exposed to light, for example, having a wavelength of 365 nm and an intensity of 200 to 400 mJ/cm², through a glass mask having predetermined patterns formed thereon, and developed with a 1% aqueous solution of sodium carbonate. Thus, epoxy acrylate resin layer 54 is formed only in the predetermined regions corresponding to electrode 51 and connection 52, and via holes 55 are formed at the same time [step (b)]. Subsequently, a benzocyclobutene resin film having photosensitivity is applied according to a coating technique such as spin coating or curtain coating, exposed to light through a mask corresponding to via holes 55, and then developed. Thus, a benzocyclobutene resin film 57 having via holes 56 is formed to obtain an interconnection structure 58 [step (c)]. Similarly to the above-described embodiment, a multilayer interconnection structure 59 having any desired number of layers can also be made by repeating steps (a) to (c) [FIG. 12(*d*)].

In these interconnection structures, a fluorene skeleton-containing epoxy acrylate resin layer is formed on a substrate having metallic conductor connections or metallic conductor electrodes, and a benzocyclobutene resin film is formed thereon. Consequently, there can be made an interconnection structure having high insulation reliability wherein the long-term reliability of adhesion can be secured and the migration of copper and other metallic ions can be prevented, without detracting from the excellent performance inherent in benzocyclobutene resin.

According to the second aspect of the present invention, there is provided a low-cost method of making a multilayer interconnection structure by employing a wet process. This method is more specifically described below.

As stated before, in order to perform electroless plating, a catalyst forming nuclei for the plating reaction must be supplied to the surface of an insulating substrate. However, since the above-described materials have a very smooth surface, the catalyst cannot readily be attached to the substrate unless the latter is subjected to a suitable surface treatment. Or, even if the catalyst can be attached thereto, it is difficult to achieve a satisfactory adhesion strength between the deposited film and the substrate. Accordingly, it is necessary to roughen the surface of the insulating substrate.

Accordingly, if only the surface regions on which conductor patterns are to be formed are roughened, supplied with a catalyst, and subjected to electroless plating, connection patterns are selectively formed only on the roughened surface regions, and no conductor is formed on the other surface regions. Or, even if a conductor is formed thereon, it can be easily peeled off.

According to the present invention, in order to achieve good adhesion between an electrolessly deposited film and an insulating film and to obtain a multilayer interconnection structure suitable for the mounting of semiconductor devices, the surface of the insulating film must be roughened under specific conditions. That is, the average roughness (Ra), maximum roughness (Ry) and conductor thickness (T) of the roughened surface must satisfy the following relations.

$$0.2 \leq Ra \leq 0.6 \text{ (unit: } \mu m) \tag{1}$$

$$0.02 \leq Ra/T \leq 0.2 \tag{2}$$

$$0.05 \leq Ry/T \leq 0.5 \tag{3}$$

If the lower limit of each inequality is not attained, the adhesion of the insulating film to the conductor will be insufficient, so that the resulting multilayer interconnection structure will have poor reliability. If the upper limit of each inequality is exceeded, the flatness of the surface will be detracted from. As the number of layers is increased, this tendency becomes more pronounced and brings about a greater disadvantage for mounting purposes.

No particular limitation is placed on the method for roughening the surface. However, when a physical treatment such as buffing is used alone, the roughened surface has coarse irregularities and it may be difficult to achieve good adhesion. Accordingly, it is preferable to use a chemical treatment in combination with the physical treatment.

As the material of the insulating film, there may be used a fluorene skeleton-containing epoxy acrylate resin as described above, or benzocyclobutene resin.

Although the latter material (i.e., benzocyclobutene resin) is more expensive than the aforesaid fluorene skeleton-containing epoxy acrylate resin, it has higher thermal resistance, a lower coefficient of thermal expansion, and a lower degree of water absorption, as well as a lower dielectric constant. Thus, this material is suitable for use as an insulating material. Since the method of making a multilayer interconnection structure in accordance with the present invention involves only a low cost, multilayer interconnection structures can be made on a practical level even when such an expensive material is used.

In order to form an insulating film from either of these materials, a so-called varnish prepared by dissolving the resin in a solvent is applied to an insulating substrate according to a suitable coating technique such as spin coating, spray coating or printing, and the resulting coating film is thermally cured. As compared with polyimides and the like, the resins used in the present invention have lower molecular weights and their varnishes have lower viscosity. Accordingly, the coating film has very good smoothness.

However, the thermally cured film of the fluorene skeleton-containing epoxy acrylate resin or benzocyclobutene resin has good chemical resistance, so that it is difficult to roughen its surface.

Accordingly, an effective method is to subject a semicured resin film having a limited degree of thermal cure in the range of 15 to 60% to a roughening treatment and, thereafter, thermally cure it further. If the degree of thermal cure is less than 15%, the film may be damaged during physical and chemical roughening treatments. On the other hand, if it is greater than 60%, the film will have unduly high chemical resistance and the effect of the chemical roughening treatment will be lessened. No particular limitation is placed on the type of the chemical agent used for chemical roughening purposes. For example, there may be used chromates, permanganates and alkali metal hydroxides which are commonly used for the desmearing treatment of printed wiring boards. Moreover, a pretreatment such as swelling with an organic solvent may be made as required.

Generally, a tedious procedure is required to selectively roughen the surface regions on which a conductor is to be formed. Accordingly, it is advisable to roughen the whole surface of the insulating resin film in advance and overlay it with a patterned film of the fluorene skeleton-containing epoxy acrylate resin or benzocyclobutene resin which also functions as a plating resist. This is advantageous because the underlying roughened surface is exposed only in the regions on which conductor patterns are to be formed and the other regions are covered with a smooth resin film, so that a catalyst can be selectively supplied to the surface regions on which conductor patterns are to be formed.

The catalyst treatment which will be described later may be performed after the underlying roughened layer has been thermally cured to a degree of cure of greater than 60% and preferably 70% or greater. Alternatively, it is also possible to subject the roughened layer having a degree of cure in the range of 15 to 60% to the catalyst treatment and thermally cure it further to a degree of cure of greater than 60%.

Generally, a noble metal such as palladium is used as the catalyst for electroless plating. In particular, a colloidal type of palladium is frequently used because of its good workability. However, since a colloidal type of noble metal has poor adsorption selectivity to materials, it usually tends to become adsorbed on the surface of the plating resist and cause the electroless deposition of metal thereon.

According to the present invention, instead of using such a noble metal catalyst, catalyst nuclei are supplied by forming a layer of a metallic compound reducible to metal, reducing this metallic compound, and then subjecting it to displacement palladium plating.

Specifically, after a solution of the aforesaid metallic compound is applied to the roughened insulating resin film and heat-treated, a plating resist is formed thereon. Alternatively, after plating resist patterns consisting of the fluorene skeleton-containing epoxy acrylate resin or benzocyclobutene resin are formed on the roughened insulating resin film, a solution of the aforesaid metallic compound is applied thereto and heat-treated. Thus, the regions on which the deposition of metal by electroless plating is desired have a roughened surface, and the regions on which no metal deposition is desired have a smooth surface, so that the roughened surface regions are plated preferentially.

Moreover, both the fluorene skeleton-containing epoxy acrylate resin and benzocyclobutene resin are highly hydrophobic and hence desirable in that the smooth surface is scarcely wetted with a solution prepared by dissolving the aforesaid metallic compound in a hydrophilic solvent as will be described later. Thereafter, the metallic compound is reduced and then subjected to displacement palladium plating.

Of the above-described two procedures, the former forms a metallic compound layer on the whole surface of the underlying insulating resin layer. Accordingly, the metallic compound itself must have good insulating properties. As this metallic compound, there may be used at least one compound selected from the group consisting of the nitrates, sulfates, chlorides, oxalates, acetates and oxides of cobalt, nickel, iron and copper. As the solvent for dissolving this metallic compound, there may be used purified water, water acidified with hydrochloric acid, alcohols and the like. Such a solution is applied to the insulating resin film and then heat-treated so as to cause the metallic compound to adhere closely to the insulating resin film. Moreover, in order to enhance its insulating properties, it is preferable to subject the substrate to an oxygen plasma treatment.

As the reducing agent for reducing the metallic compound, there may be used any reducing agent that can reduce the metallic compound. Specific examples thereof include $H_2$, HI, CO, and boron compounds such as sodium boron hydride, potassium boron hydride, dimethylaminoborane and ammonia borane. As the method of reduction, there may be employed any of various reduction reactions suitable for the reducing agent used. For example, when $H_2$ gas is used as the reducing agent, the metallic compound can be reduced by heating the substrate at about 200° C. in an atmosphere of $H_2$ gas. When sodium boron hydride is used, the metallic compound can be reduced by preparing an aqueous solution of the sodium boron hydride having a concentration about 0.1 to 1 g/l and soaking the substrate in this solution for several minutes.

Subsequently, the surface of the resulting metallized layer is subjected to displacement palladium plating, so that palladium forming catalyst nuclei for electroless plating is deposited thereon. In this step, the substrate having undergone the reduction treatment may be directly subjected to the plating treatment. However, the rate of metal deposition and the adhesion between the deposited metal and the substrate can be improved by washing the surface of the substrate having undergone the reduction treatment with an acid or the like. Although no particular limitation is placed on the method of displacement palladium plating, this can be accomplished, for example, by preparing an aqueous solution containing about 0.5 to 5 mM/l of palladium chloride and acidified with hydrochloric acid (to a pH of about 0.5 to 3), and soaking the substrate in this solution for a period of time ranging from several seconds to several minutes.

When a copper compound is used as the metallic compound, displacement palladium plating is not necessarily required because the reduced copper itself acts as catalyst nuclei for electroless plating.

Finally, the substrate is subjected to electroless plating. Although no particular limitation is placed on the plating material, the use of copper or nickel which is commonly used in wiring boards is preferred from the viewpoint of cost reduction. As the plating method, there may employed any of various methods which are commonly used for plating with these metals. For example, in the case of copper plating, there may be used a copper sulfate plating bath, a copper pyrophosphate plating bath or a copper cyanide plating bath. In the case of nickel plating, there may be used a nickel sulfate or nickel chloride plating bath in which sodium hypophosphite or sodium boron hydride is used as the reducing agent.

When it is desired to form fine connection patterns, the full additive method using electroless plating alone is preferred as described above. However, if necessary, electroplating may be used in combination with electroless plating. According to an exemplary procedure, a metal film is electrolessly deposited on the whole surface of the underlying insulating resin layer which has been roughened in advance. Then, patterns of a commercially available plating resist are formed thereon, and the exposed portions of the metal film are thickened by electroplating. After the plating resist is removed, the unnecessary portions of the electrolessly deposited metal film may be removed by quick etching.

According to an alternative procedure, after patterns of the aforesaid fluorene skeleton-containing epoxy acrylate resin or benzocyclobutene resin are formed on the underlying insulating resin layer which has been roughened in advance, a metal film is electrolessly deposited on the whole surface thereof in the same manner as described above. Thereafter, the unnecessary portions of the electrolessly deposited metal film may be removed by buffing or the like.

When such an etching process is used, catalyst nuclei for electroless plating can be supplied not only by employing the above-described method, but also by employing the common catalyst supply process using a colloidal type of palladium. Alternatively, this can be accomplished by soaking the substrate in a stannic chloride solution acidified with hydrochloric acid (sensitizing) and then in a palladium chloride solution (activating).

As described above, a multilayer interconnection structure having any desired number of layers can also be made by forming insulating resin layers and conductor layers repeatedly.

Moreover, through-holes for interlayer connection can be formed in the aforesaid multilayer interconnection structure. This can be accomplished by forming through-holes prior to the formation of a final conductor, applying a solution of the aforesaid metallic compound to the inside of the through-holes or dipping the substrate in this solution, and then treating the substrate in the same manner as described above.

The present invention is further illustrated by the following examples. However, it is to be understood that the present invention is not limited thereto.

EXAMPLE 1

An interconnection structure was made according to the steps illustrated in FIG. 1. First of all, a conductor film 1 consisting of a metal such as aluminum or copper was coated with a coating solution having dissolved therein a fluorene skeleton-containing epoxy acrylate resin of the above general formula (I) (R=H, n=0), according to a coating technique such as spin coating, spray coating or printing. Thus, a coating film 2 was formed [FIG. 1(a)]. After being baked at 75° C. for 10 minutes, this coating film 2 was exposed to light, for example, having a wavelength of 365 nm and an intensity of 200 mJ/cm$^2$, through a glass mask 3 which had been subjected to a predetermined patterning treatment [FIG. 1(b)]. Then, this coating film 2 was developed by soaking it in an alkaline developing solution based on sodium carbonate or an amine to dissolve the unexposed portions thereof. Thereafter, this coating film 2 was heat-treated (post-baked) at 180°–200° C. for about 30 minutes to solidify the exposed portions and thereby form an interlayer insulating film 5 having via holes 4 [FIG. 1(c)].

Subsequently, a conductor layer consisting of a metal such as copper or aluminum was formed on interlayer insulating film 5 according to a suitable technique such as sputtering, vapor deposition or electroless plating. Then, this conductor layer was etched into a desired shape according to a photolithographic process or the like to form conductor connections 6. Thus, there was obtained a multilayer interconnection structure 7 [FIG. 1(d)].

Subsequently, a multilayer interconnection structure 8 having a desired number of layers was made by repeating the step of forming an interlayer insulating film and the step of forming conductor connections [FIG. 1(e)]. Moreover, if necessary, a multilayer interconnection structure 10 having conductor connections 9 formed thereon can be made by etching conductor film 1 into a desired shape, as illustrated in FIG. 1(f).

Since coating film 2 was developed with an alkaline developing solution, the exposed regions of coating film 2 did not swell and, moreover, the degree of shrinkage of interlayer insulating films 5 formed by thermal curing was as low as about 6%. Consequently, highly precise and minute via holes 4 could readily be obtained. Properties of the interlayer insulating films so formed are shown in Table 1.

TABLE 1

| | |
|---|---|
| Dielectric constant | 3.1–3.2 (1 MHZ) |
| Dielectric dissipation factor | 0.001–0.002 (1 MHZ) |
| Coefficient of thermal expansion | 10 ppm (TMA method, 30–200° C.) |
| Degree of water absorption | 1.0% (immersion in distilled water for 24 hours) |
| Weight loss starting temperature | >300° C. (TG method, in air) |

As can be seen from Table 1, the present invention makes it possible to prepare interconnection structures having excellent properties such as high thermal resistance, low dielectric constant, low coefficient of thermal expansion, and low degree of water absorption.

Although a fluorene skeleton-containing epoxy acrylate resin with n=0 was used in this example, it has been recognized that, as the value of n becomes greater, the weight loss starting temperature tends to be raised and the degree of water absorption tends to be reduced.

EXAMPLE 2

FIGS. 2 to 6 are sectional views illustrating a sequence of steps in the method of making a multilayer interconnection structure wherein a fluorene skeleton-containing epoxy acrylate resin of the above general formula (I) is used as an insulating film material on a substrate comprising a printed wiring board and conductor electrode patterns are formed thereon.

Figure 2:
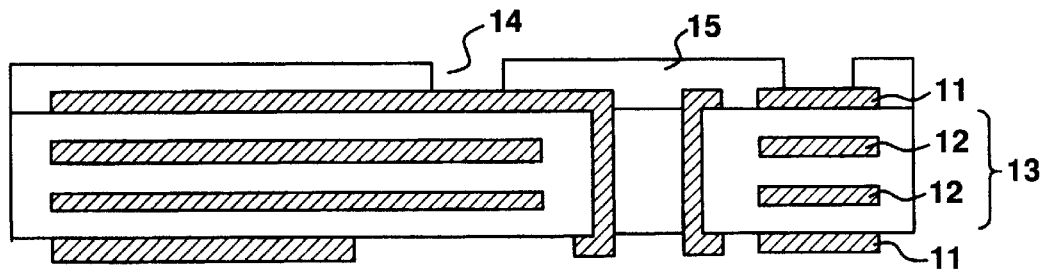
FIGS. 2 to 6 are sectional views illustrating another embodiment of the method of making a multilayer interconnection structure in accordance with the present invention.

A printed wiring board 13 having surface conductor electrodes 11 and internal conductors 12 was coated with a fluorene skeleton-containing epoxy acrylate resin, and subjected to exposure, development and curing processes. Thus, an interlayer insulating film 15 having via holes 14 was formed (FIG. 2).

Figure 3:
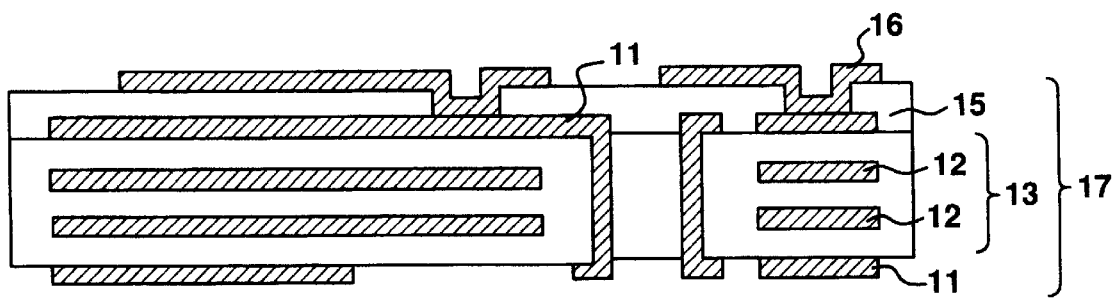
Figure 4:
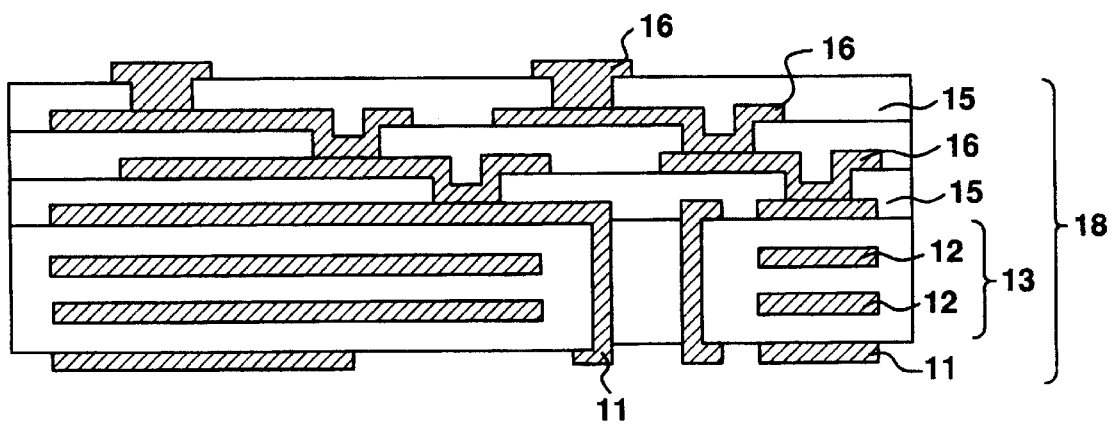
Figure 5:
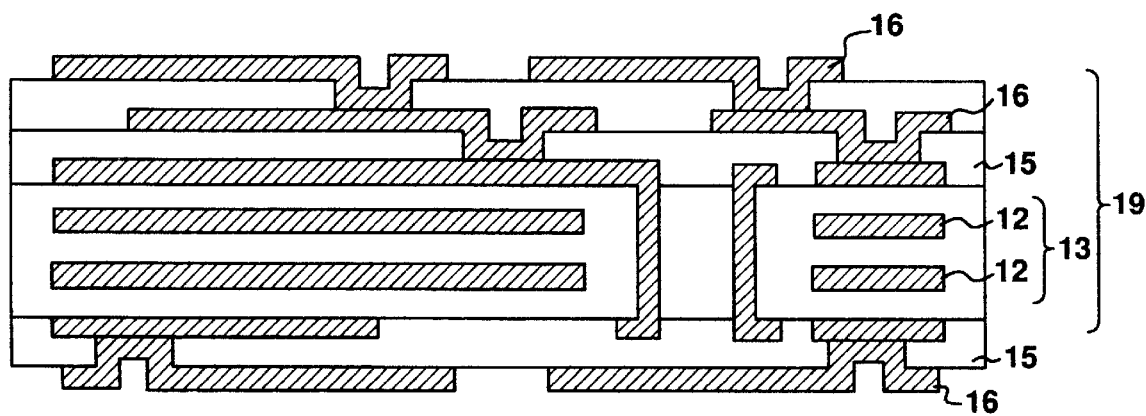
Figure 6:
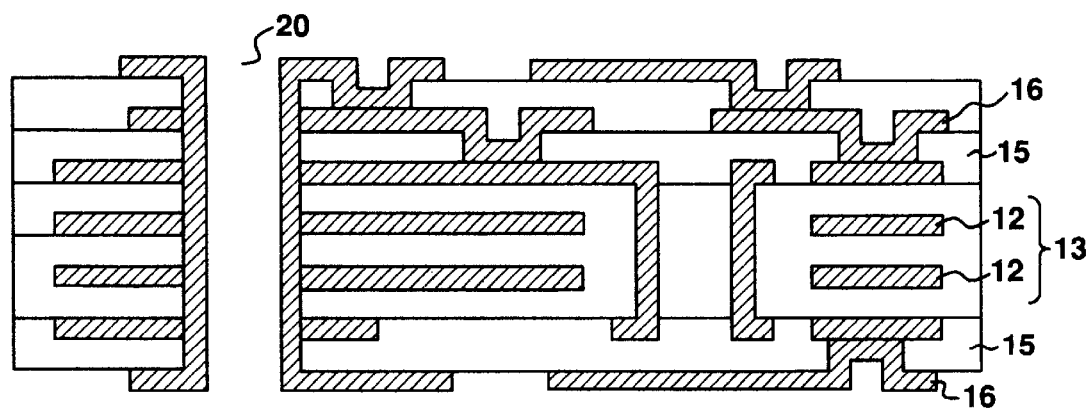
Figure 7A:
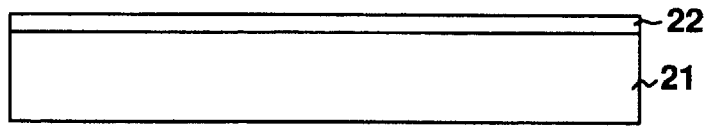
Figure 7B:
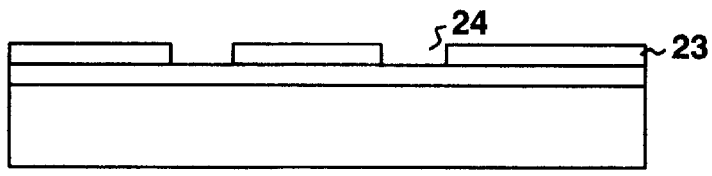
Figure 7C:
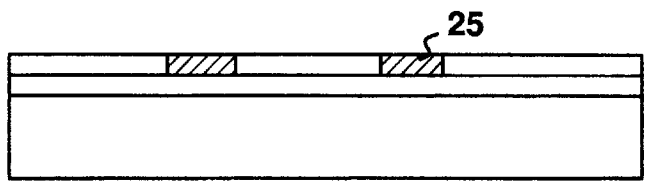
Figure 7D:
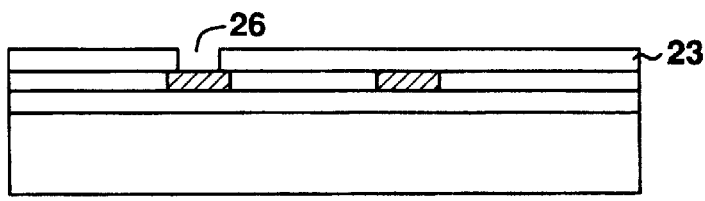
Figure 7E:
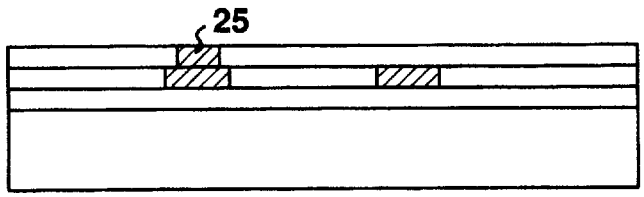

Then, a conductor layer consisting of a metal such as copper or aluminum was deposited on interlayer insulating film 15 according to a suitable technique such as sputtering, vapor deposition, electroplating or electroless plating, and etched into a desired shape to form conductor electrode patterns 16. Thus, there was obtained a multilayer interconnection structure 17 (FIG. 3). If necessary, a multilayer interconnection structure 18 having any desired number of layers can be made by repeating the step of forming an interlayer insulating film and the step of forming conductor electrode patterns (FIG. 4). Moreover, an interlayer insulating film 15 and conductor electrode patterns 16 may also be formed on the back side of printed wiring board 13 to make a multilayer interconnection structure 19 (FIG. 15). Furthermore, surface conductor electrodes 11, internal conductors 12 and conductor electrode patterns 16 may be electrically connected by means of a through-hole 20 (FIG. 6).

EXAMPLE 3

As illustrated in FIG. 11, a substrate 43 comprising an epoxy resin printed wiring board (FR-4) having a thickness of 1 mm was coated with a fluorene skeleton-containing epoxy acrylate resin layer 44 to a thickness of about 0.1–1.0 $\mu$m. This resin layer 44 was dried at 75° C. for 10 minutes and exposed to light having a wavelength of 365 nm and an intensity of 200–400 mJ/cm². Then, a benzocyclobutene resin film having a thickness of 10 $\mu$m was applied by spin coating and subjected to exposure and development processes. Thus, a benzocyclobutene resin film 46 having via holes 45 was formed [step (b)]. After substrate 43 was heat-treated at 80°–200° C. for about 30 minutes, the fluorene skeleton-containing epoxy acrylate resin layer 44 present at the bottom of via holes 45 was removed by plasma etching or the like to obtain an interconnection structure 47 [step (c)]. Then, comb-shaped copper connections 48 having a width of 20 $\mu$m, a spacing of 20 $\mu$m and a thickness of 5 $\mu$m were formed thereon to obtain an interconnection structure illustrated in FIG. 11(d).

A pressure cooker bias test (at a temperature of 121° C., a relative humidity of 100%, a pressure of 2 atmospheres, and a bias voltage of 12 V) was performed on interconnection structures made in the above-described manner. As a result, neither deterioration in insulating properties nor migration of copper ion was observed even after the lapse of 100 hours. Moreover, similar results were obtained when the fluorene skeleton-containing epoxy acrylate resin layer was patterned as illustrated in FIG. 12.

On the other hand, interconnection structures were made by coating a similar substrate with a 3-aminopropyltriethoxysilane film layer, in place of the fluorene skeleton-containing epoxy acrylate resin layer, and subsequently treating it in the same manner as described above. When a pressure cooker bias test was performed on these interconnection structures in the same manner as described above, it was recognized that the migration of copper ion began to occur after the lapse of 60 hours and some of them showed a deterioration in insulating properties.

EXAMPLE 4

Now, an example of the method of making an interconnection structure by employing a wet process according to the second aspect of the present invention is described below. FIG. 7 is a series of schematic sectional views for explaining several steps in one embodiment of this method of the present invention.

After a substrate 21 was coated with a fluorene skeleton-containing epoxy acrylate resin, this epoxy acrylate resin was heat-treated to form a semicured epoxy acrylate resin film 22 having a degree of cure of 20% [step (a)]. After its surface was roughened by buffing and soaking in an aqueous chromate solution so as to have an Ra of 0.43 $\mu$m and an Ry of 2.5 $\mu$m, epoxy acrylate resin film 22 was heat-treated again until a degree of cure of 80% was achieved.

Subsequently, the surface of the substrate was uniformly coated with a 0.05M aqueous solution of nickel nitrate, heat-treated at 150° C. for 3 hours, and subjected to an oxygen plasma treatment at 150° C. for 1 minute. Then, a fluorene skeleton-containing epoxy acrylate resin 23 was applied again thereto, exposed, developed and thermally cured (to a degree of cure of 80%) to form connection patterns 24. After being thermally cured, this resin film had a thickness of 6 $\mu$m.

This substrate was subjected to a reduction treatment in a 1 g/l aqueous solution of sodium boron hydride for 5 minutes, washed thoroughly with water, soaked in a 0.001M solution of palladium chloride acidified with hydrochloric acid (pH 1.5) for 1 minute, washed thoroughly with water, and then soaked in an electroless copper plating solution (KC-500®; manufactured by Japan Energy Co., Ltd.). Thus, copper was deposited as a conductor 25 to a thickness of 6 $\mu$m within the aforesaid connection patterns 24 [step (c)].

Subsequently, the surface of the aforesaid substrate was roughened in the same manner as described above, and a nickel nitrate-treated layer was formed again thereon. Then, a fluorene skeleton-containing epoxy acrylate resin film 23 was applied thereto, exposed, developed and thermally cured (to a degree of cure of 80%) to form a via hole 26 [step (d)]. Thereafter, in the same manner as described above, the nickel nitrate layer present at the bottom of via hole 26 was reduced and subjected to displacement palladium plating and electroless copper plating. Thus, copper was deposited as a conductor 25 within via hole 26 [step (e)].

Moreover, as illustrated in FIG. 8(a) to 8(f), a multilayer interconnection structure having a three-conductor-layer/blind-via configuration can be made by repeating the above-described procedure until a desired number of epoxy acrylate resin films 23 and conductors 25 are formed.

EXAMPLE 5

FIG. 9 illustrates another example of a three-conductor-layer interconnection structure similar to that described in Example 4.

The steps (a) to (c) of FIG. 7 were performed in the same manner as described in Example 4. Instead of the aforesaid step (d), a fluorene skeleton-containing epoxy acrylate resin film 22 was deposited on the substrate and a via pattern 26 was formed therein, as illustrated in FIG. 9(a). After this epoxy acrylate resin film 22 was thermally cured (to a degree of cure of 20%), its surface was roughened by buffing and soaking in an aqueous chromate solution so as to have an Ra of 0.43 $\mu$m and an Ry of 2.5 $\mu$m. Thereafter, epoxy acrylate resin film 22 was heat-treated again until a degree of cure of 80% was achieved, and subjected to a nickel nitrate solution treatment and an oxygen plasma treatment. Then, as illustrated in FIG. 9(b), a fluorene skeleton-containing epoxy acrylate resin film 23 (having a degree of cure of 80%) was deposited thereon and connection patterns 24 were formed in the two films 22 and 23. The nickel nitrate layers present at the bottom of via pattern 26 and within connection patterns 24 were reduced and subjected to displacement palladium plating and electroless copper plating. Thus, copper was deposited as a conductor 25 within via pattern 26 and connection patterns 24 [FIG. 9(c)].

The above-described procedure was repeated to form an epoxy acrylate resin film 22 and via patterns 26 [FIG. 9(d)], an epoxy acrylate resin film 23 and connection patterns 24 [FIG. 9(e)], and a conductor 25. Thus, there was obtained a multilayer interconnection structure having a three-conductor-layer/blind-via configuration as illustrated in FIG. 9(f).

EXAMPLE 6

FIG. 10 is a schematic sectional view illustrating an example of the method of making a three-conductor-layer interconnection structure wherein benzocyclobutene resin is used as an insulating material on a substrate.

Figure 10A:
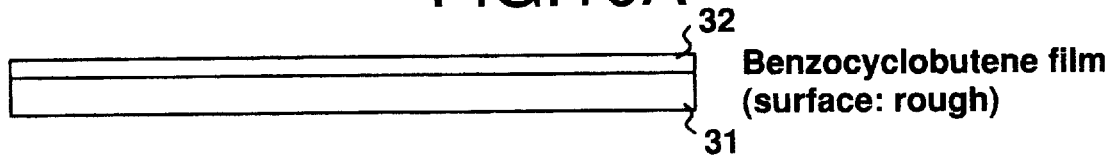
Figure 10B:
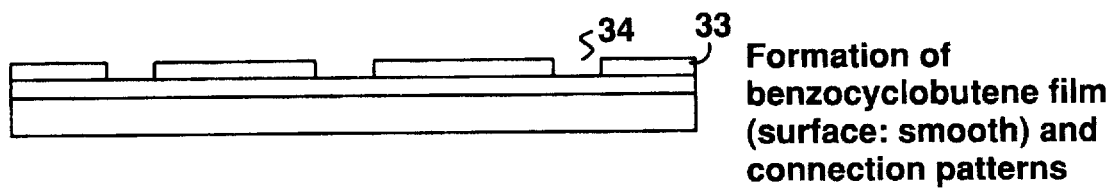
Figure 10C:
Figure 10D:
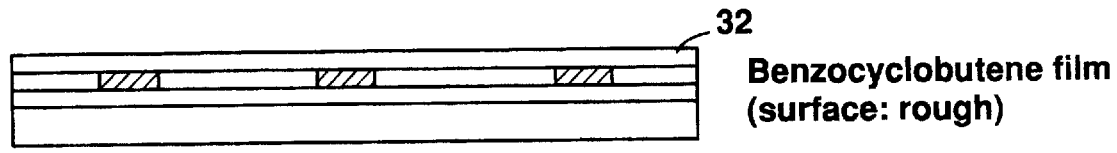
Figure 10E:
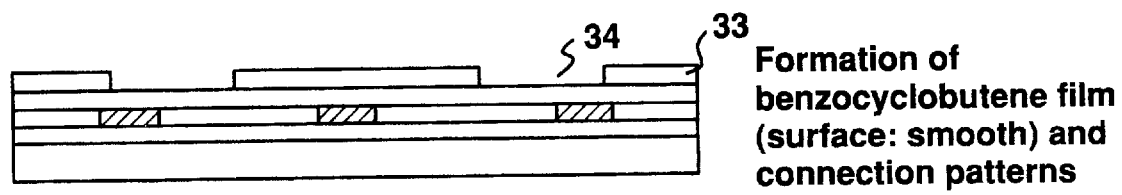
Figure 10F:
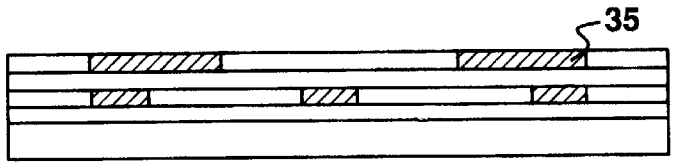
Figure 10G:
Figure 10H:
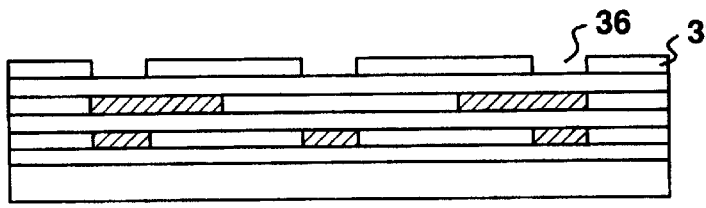
Figure 10I:
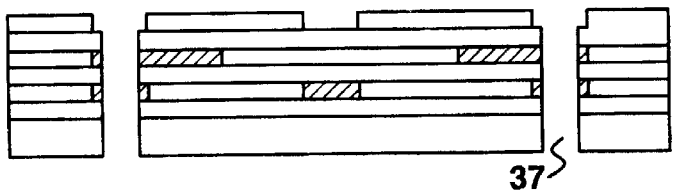
Figure 10J:
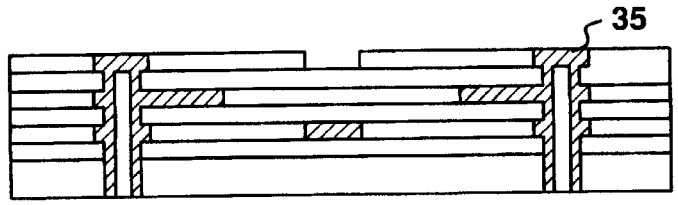
Figure 11A:
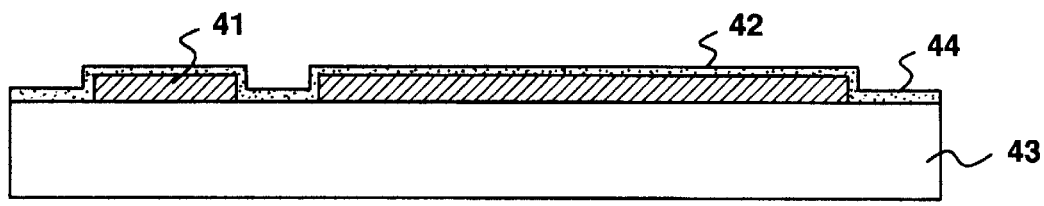
FIGS. 11 and 12 are schematic sectional views for explaining the methods of making an interconnection structure in which the migration of metallic ions is prevented.
Figure 11B:
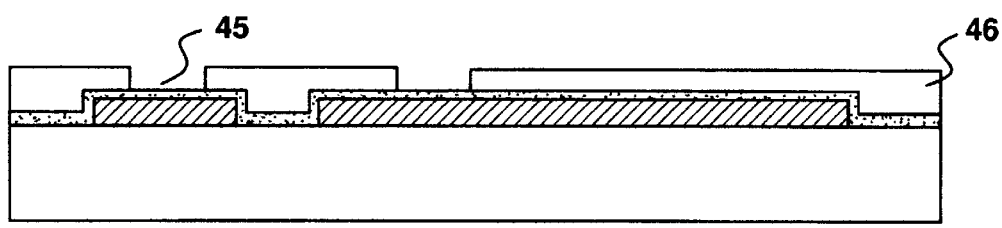
Figure 11C:
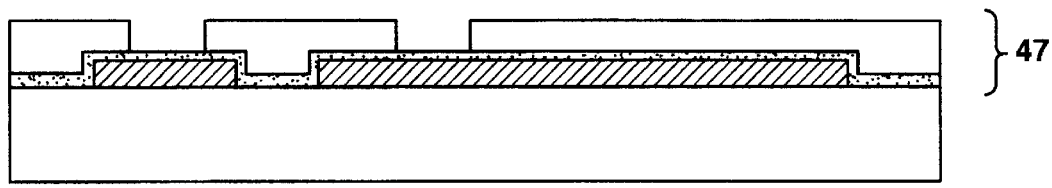
Figure 11D:
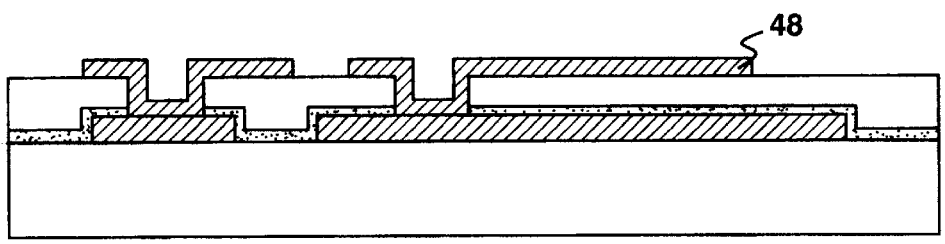
Figure 11E:
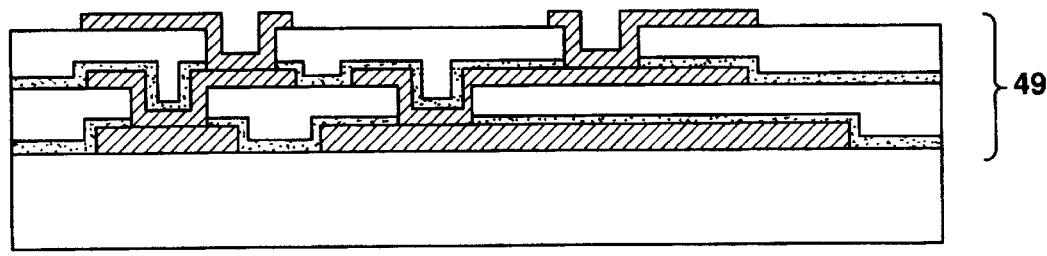
Figure 12A:
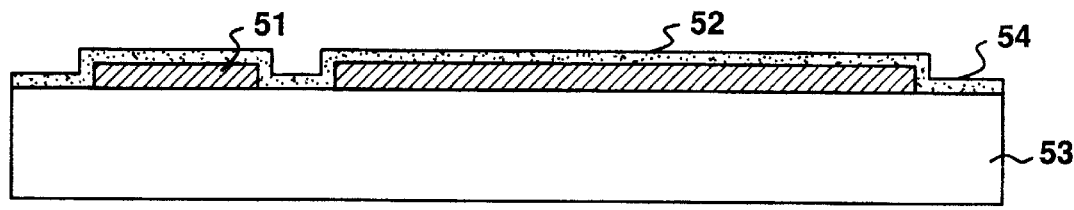
Figure 12B:
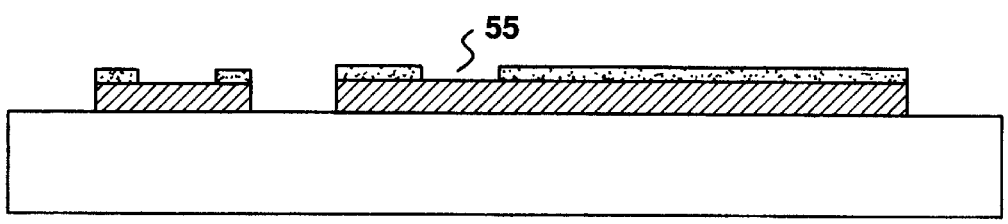
Figure 12C:
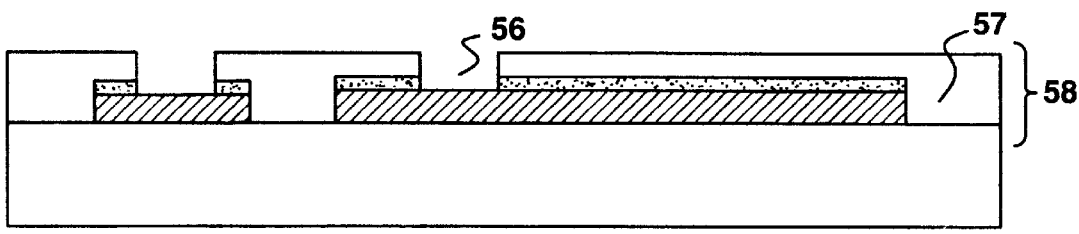
Figure 12D:
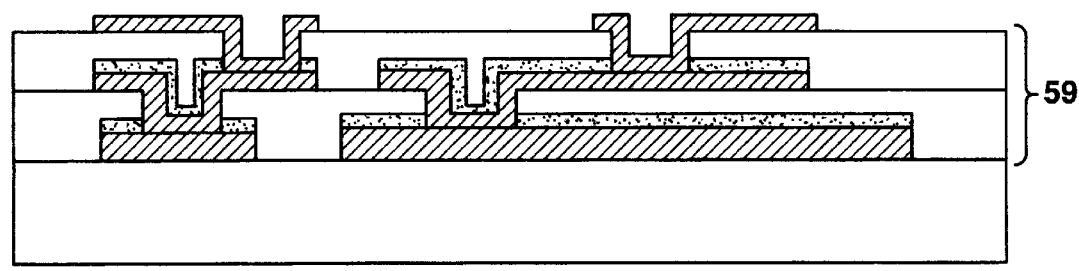
Figure 13:
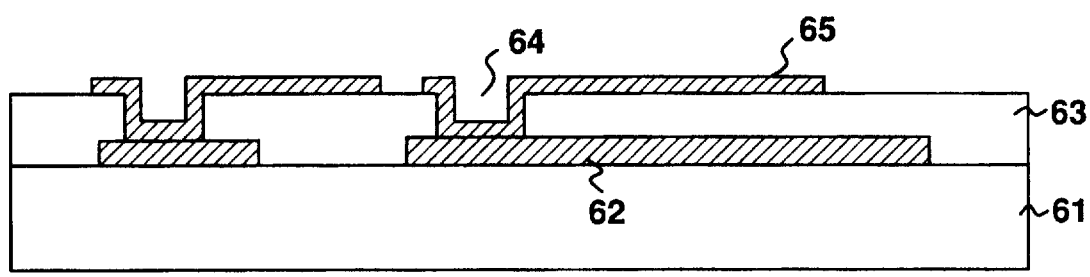
FIG. 13 is a schematic sectional view illustrating a conventional interconnection structure using benzocyclobutene resin.
Figure 14:
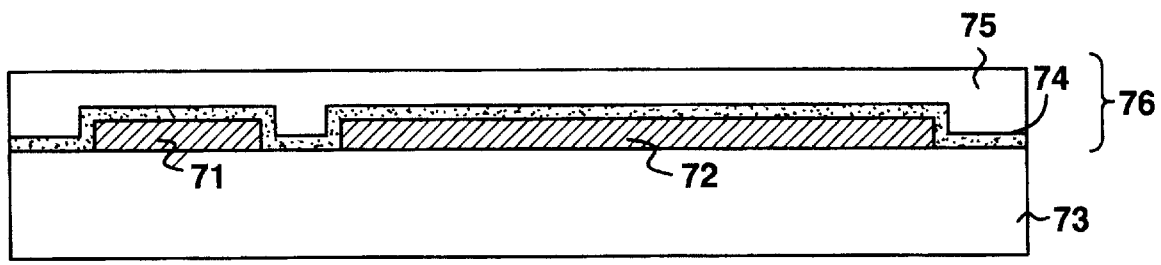
FIG. 14 is a schematic sectional view illustrating a conventional interconnection structure having improved adhesion.

After a substrate 31 was coated with a 1% aqueous solution of 3-aminopropyltriethoxysilane, benzocyclobutene resin was applied thereto and heat-treated to form a semicured film (benzocyclobutene film) 32 having a degree of cure of 15% [FIG. 10(a)]. After its surface was roughened by buffing and soaking in an aqueous permanganate solution so as to have an Ra of 0.28 μm and an Ry of 3.2 μm, benzocyclobutene film 32 was heat-treated again until a degree of cure of 70% was achieved. After this substrate was coated again with a 1% aqueous solution of 3-aminopropyltriethoxysilane, benzocyclobutene resin was applied thereto, exposed, developed and thermally cured (to a degree of cure of 70%) to form a benzocyclobutene film 33 and connection patterns 34 [FIG. 10(b)]. After being cured, this resin film 33 had a thickness of 7 μm.

Subsequently, the surface of the substrate was uniformly coated with a 0.02M aqueous solution of copper sulfate, heat-treated at 150° C. for 3 hours, and subjected to an oxygen plasma treatment at 150° C. for 1 minute.

This substrate was subjected to a reduction treatment in a 0.5 g/l aqueous solution of potassium boron hydride for 10 minutes, washed thoroughly with water, and then soaked in an electroless copper plating solution (KC-500®; manufactured by Japan Energy Co., Ltd.). Thus, copper was deposited as a conductor 35 to a thickness of 7 μm within connection patterns 34 [FIG. 10(c)].

As illustrated in FIG. 10(d) to 10(h), the above-described formation of an insulating resin layer and a conduction was repeated until a desired number of layers were formed. Then, through-holes 37 were made at predetermined positions [FIG. 10(i)]. Thereafter, a final conductor 35 was formed by soaking this substrate in a copper sulfate solution and treating in the same manner as described above [FIG. 10(j)].

It goes without saying that, if 3-aminopropyltriethoxysilane used in this example is replaced by a fluorene skeleton-containing epoxy acrylate resin, the migration of copper ion is prevented as shown in Example 3 and, therefore, an interconnection structure having a higher degree of reliability can be obtained.

What is claimed is:

1. An interconnection structure comprising one or more insulating films and one or more layers of conductor electrode patterns, wherein at least one of said one or more insulating films comprises a first insulating film which comprises a fluorene skeleton-containing epoxy acrylate resin represented by the following general formula (I):

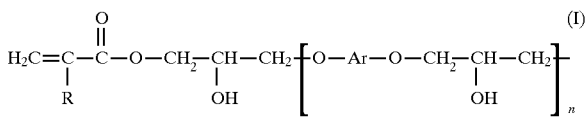

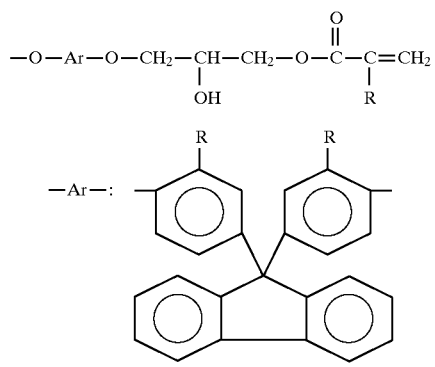

where R is a hydrogen atom or a lower alkyl group, and n is 0 or an integer of 1 to 20.

2. An interconnection structure as claimed in claim 1 wherein one or more interlayer insulating films and one or more layers of conductor electrode patterns are alternately and successively formed to make a multilayer interconnection structure.

3. An interconnection structure as claimed in claim 1 or 2 wherein said first insulating film is formed on a substrate, and said conductor electrode patterns are formed on said first insulating film.

4. An interconnection structure as claimed in claim 3 wherein said substrate is a printed wiring board or a molded resin wiring board.

5. An interconnection structure as claimed in claim 1 wherein said first insulating film is formed on a substrate having metallic conductor connections or metallic conductor electrode patterns, and wherein said one or more insulating films further comprises a second insulating film comprising benzocyclobutene resin which is formed on said first insulating film.

6. An interconnection structure as claimed in claim 5 wherein said first insulating film is patterned so as to exist only on said metallic conductor connections or metallic conductor electrode patterns.

7. An interconnection structure as claimed in claim 1 wherein said first insulating film comprises surface regions that have a roughened surface.

8. An interconnection structure as claimed in claim 1 wherein said first insulating film comprises surface regions that have an average roughness (Ra), wherein $0.2 \leq Ra \leq 0.6$ (unit: μm).

9. An interconnection structure as claimed in claim 1 wherein said first insulating film has an average thickness of about 0.1 to 1.0 μm.

* * * * *